United States Patent [19]

Nishizawa et al.

[11] 4,389,256
[45] Jun. 21, 1983

[54] METHOD OF MANUFACTURING PN JUNCTION IN GROUP II-VI COMPOUND SEMICONDUCTOR

[75] Inventors: Jun-ichi Nishizawa, No. 6-16, Komegafukuro 1-chome, Sendai-shi, Miyagi-ken; Kazuomi Ito, Ashikaga, both of Japan

[73] Assignee: Jun-ichi Nishizawa, Sendai, Japan

[21] Appl. No.: 270,816

[22] Filed: Jun. 5, 1981

[30] Foreign Application Priority Data

Jun. 16, 1980 [JP] Japan ................................. 55-81212

[51] Int. Cl.³ .......................................... H01L 21/324
[52] U.S. Cl. .................................... 148/1.5; 148/189; 148/177; 148/188; 29/569 L
[58] Field of Search ................ 148/177, 188, 189, 1.5, 148/171, 172; 29/569 L

[56] References Cited

U.S. PATENT DOCUMENTS

| | | | |
|---|---|---|---|
| 3,326,730 | 6/1967 | Mandel et al. | 148/189 |
| 3,549,434 | 12/1970 | Aven | 148/1.5 X |
| 3,615,877 | 10/1971 | Yamashita | 148/189 X |
| 3,858,306 | 1/1975 | Kloek et al. | 148/171 X |

Primary Examiner—G. Ozaki
Attorney, Agent, or Firm—Cushman, Darby & Cushman

[57] ABSTRACT

A method of manufacturing a pn junction in a substantially n-type ZnSe compound semiconductor crystal grown by relying on a liquid growth method using temperature difference technique, by diffusing therein gold which is a p-type impurity or by forming therein a gold alloy in an inert gas atmosphere. This impurity has such a high diffusion velocity as can suppress the vaporization, from ZnSe crystal, of Se atoms having a vaporization speed lower than the diffusion speed of gold, and thus desired pn junction can be formed.

14 Claims, 2 Drawing Figures

METHOD OF MANUFACTURING PN JUNCTION IN GROUP II-VI COMPOUND SEMICONDUCTOR

BACKGROUND OF THE INVENTION (a) Field of the Invention

The present invention relates to a method of manufacturing a semiconductor pn junction in a Group II-VI compound semiconductor, and more particularly it pertains to a method of manufacturing a ZnSe pn junction.

(b) Description of the Prior Art

Those Group II-VI compound semiconductors such as ZnS and ZnSe have a relatively large energy band gap. Light-emitting diodes (hereinafter abbreviated as LED) made of Group III-V compound semiconductors such as GaAs have their peak intensity of light emission at about 5500 Å at the maximum, and they are unable to emit light in a region of wavelength shorter than that. If, however, it is possible to form a pn junction by the use of a semiconductor material selected from Group II-VI compound semiconductors having large energy band gaps, there will be obtained LEDs having a light-emission wavelength range whose peak intensity is shorter than about 5500 Å which, in terms of color in the visible light wavelengths, ranges from blue-green to blue-violet. Thus, it would be possible to manufacture luminescing semiconductor devices capable of emitting colored lights and also possible to expand the fields of application of such an LED.

However, it has been extremely difficult so far to form a pn junction with a semiconductor material selected from a group II-VI compound semiconductor by relying on the conventional methods in the current level of techniques.

More specifically, in the current level of techniques, it is possible to easily obtain, either through the doping of a donor impurity or through heat-treatment in a vapor such as Zn, an n type crystal portion from Group II-VI compound semiconductors such as ZnSe, CdS and ZnS.

However, the circumstances differ drastically if one wishes to obtain a p type crystal in such semiconductor materials as those mentioned above. That is, even when efforts are made to obtain a p type crystal by doping an acceptor impurity, i.e., more specifically by doping, at the time of crystal growth, an acceptor impurity to form a p type, or to change a portion of an n type Group II-VI crystal into a p type by either doping, through diffusion or as an alloy, an acceptor impurity into an n type Group II-VI crystal, still the resulting crystal remains to be an n type Group II-VI crystal or becomes a crystal close to an insulator having a very high resistivity, so that a useful desirable p type region crystal has not been obtained. Thus, it has not been possible to manufacture a pn junction which causes injection luminescence in a Group II-VI compound semiconductor according to the prior art.

The reason for it not being possible to obtain a p type semiconductor crystal portion in a Group II-VI compound semiconductor crystal according to the prior art is because of the fact that, when an acceptor impurity is introduced to obtain a p type crystal, defects develop within the crystal. These defects function as a donor in accordance with the amount of the acceptor impurity which is introduced in the crystal, with a natural trend to establish a stable-state thermodynamically, causing the development of compensation of acceptor carriers. This development of carrier compensation is called a "self-compensation phenomenon". Those defects developing within the crystal which function as the donor consist, for example, of Se vacancies which develop due to the escape of Se atoms out of the crystal, said escape taking place because, in a compound semiconductor such as ZnSe, Se atoms have a higher vapor pressure than Zn atoms, and because, for this reason, Se atoms easily escape out of the ZnSe crystal. Such defects also include a complex of Se vacancies with the doped impurity. These defects, i.e., Se vacancies and/or complexes with Se vacancies and impurity, function as a donor.

SUMMARY OF THE INVENTION

It is, therefore, an object of the present invention to eliminate those drawbacks as described above which take place in Group II-VI compound semiconductors when subjected to heat, and to repetitively obtain a stabilized p type semiconductor region, and to provide a method of manufacturing a practically useful pn junction due to the acquisition of said stabilized p type region in a Group II-VI compound semiconductor.

DETAILED DESCRIPTION OF THE PREFERRED EMBODIMENTS

Figure 1:
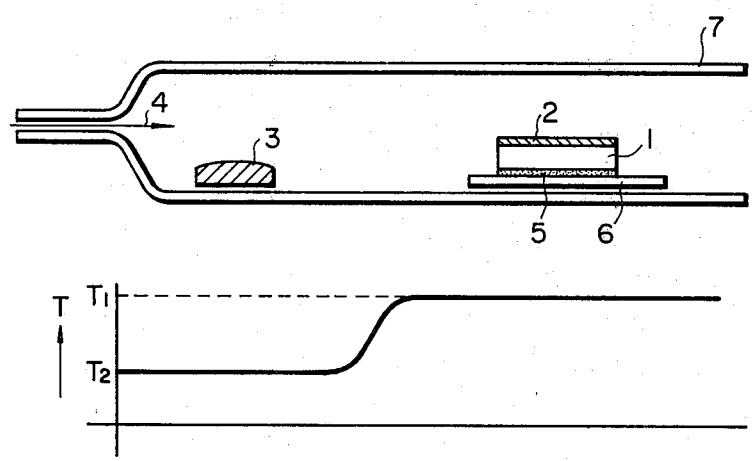
FIG. 1 is a schematic representation, showing the manner of introduction of an acceptor impurity Au using an open tube system, and the temperature distribution during this impurity-introducing step.

The Group II-VI compound semiconductor crystal made of a compound semiconductor such as ZnSe which serves as a substrate used in the formation of a practically useful pn junction desirably is a mono-crystalline substrate manufactured by relying on the method proposed by one of the present inventors in copending U.S. application Ser. No. 272,763 filed June 11, 1981 under the title "Method For Producing A Growing Group II-VI Compound Semiconductor Crystal". More specifically, a substrate crystal made of a compound semiconductor material such as ZnSe desirably is obtained by relying on a liquid growth method which adopts a temperature difference technique.

The conventional Bridgman's method of crystal growth, which is conducted at the melting point, employs a very high temperature which is about 1500° C. Even the conventional vapor transport method requires a high temperature above 1000° C. At such high temperatures, Se escapes out of a ZnSe crystal in a substantially large amount, causing prominent deviations from stoichiometry, and thus the resulting crystal is no longer suitable for the formation of a pn junction. In contrast thereto, the liquid crystal growth method using the temperature difference technique allows the production of a sufficiently good crystal at much lower temperatures, i.e., at 900° C.–950° C. or lower. The temperature being low, deviations from stoichiometry due to vaporization of S or Se can be suppressed to only a very small amount. The substrate crystal, which is manufactured according to the improved method as described above, makes the formation of a pn junction easy, since Se vacancies which will serve as a donor in the substrate crystal are preliminarily reduced. Further, these Se vacancies are held at about the same degree of concentration as that of an acceptor impurity which is to be introduced later by relying on a technique such as diffusion, or it is held even lower than that degree. It should be noted here that in said liquid crystal growth method, Te has been often used to serve as a solvent for the liquid growth. However, Te which is contained in the ZnSe which is prepared through liquid growth is in an amount of 1% or less when the crystal is grown at a temperature of 1000° C. or lower, so that the Te content is extremely small. Accordingly, the variation of the energy band gap of the resulting crystal is very small, so that the crystal which is thus obtained may be regarded safely as being substantially a pure ZnSe crystal.

If the vapor pressure control technique which is also proposed in the above-identified U.S. patent application Ser. No. 272,763 is combined with the liquid growth method under the temperature difference technique, a further desirable result will occur. That is, a substance such as Se easily evaporates, so that during the liquid growth, the atmosphere which surrounds Se or like element is converted to Se atmosphere having a controlled Se vapor pressure. By so arranging the growth conditions, the amount of Se vacancies produced within the crystal will be reduced markedly, so that deviations from stoichiometry reduce to a level lower than that obtained from the known method mentioned above.

The ratio between the density $n_v$ of Se vacancies in the crystal prepared under a controlled Se vapor pressure and the Se vacancy density $n_v^e$ of the crystal prepared without controlled Se vapor pressure is obtained approximately from the following formula:

$$\frac{n_v^e}{n_v} \approx \frac{P_{Se}}{P_{Se}^e}$$

wherein:

$P_{Se}$ represents the Se vapor pressure given by the vapor pressure control technique, and $P_{Se}^e$ represents the so-called vapor pressure under thermal equilibrium when no Se vapor pressure is applied.

For example, when a ZnSe crystal is grown by relying on the liquid crystal growth method using the temperature difference technique at, for example, 900° C., the thermal equilibrium vapor pressure $P_{Se}^e$ in the absence of vapor pressure control is about 0.1 Torr. Since the Se vapor pressure $P_{Se}$ which is applied under vapor pressure control is about $10^3$ Torr or greater, Se vacancies which are produced under vapor pressure control will reduce to about $1/10^4$ of the level obtained in the absence of a vapor pressure control, as will be noted from the foregoing formula. As discussed above, according to the present invention, the substrate crystal which is employed in the present invention is one in which Se vacancies have been preliminarily reduced to a sufficiently low level.

It should be noted, however, that the substrate crystal thus made of a compound semiconductor such as ZnSe has only a few Se vacancies serving as the donor unless a donor impurity is doped. Therefore, such a substrate crystal is close to an intrinsic crystal, and is an n type crystal having a very high resistivity, so that it is not possible to obtain a resistivity value of $10\omega$-cm or lower which allows the crystal to be used in the formation of a pn junction. Since the intrinsic carrier concentration at room temperature of ZnSe is markedly low, such an outcome results as a matter of course, so that it becomes necessary to convert the crystal into one having a resistivity necessarily low for the formation of a pn junction. Several solutions to attain this purpose will be described below.

As a simple solution or method, it is considered that a donor impurity is doped in the Group II-VI compound semiconductor when a substrate mono-crystal is manufactured by relying on a method as described above. It should be noted, however, that according to such a method, there is the inconvenience that, when an acceptor impurity is introduced into the ground crystal through a diffusion technique to thereby change the conductivity type of a portion of the crystal for the purpose of forming a pn junction, it is not possible to accomplish a satisfactory compensation for the donor impurity unless this background donor impurity in the crystal has been preliminarily suppressed to a very low concentration level. Thus, the formation of a p type region, which has been accepted to be technically very difficult, will become all the more difficult, so that this method is not considered desirable. Therefore, the following technique is considered.

First, a ZnSe mono-crystal, which is close to intrinsic and is virtually devoid of deviation in its stoichiometry is obtained, by relying on a liquid crystal growth method adopting the temperature difference technique under a controlled vapor pressure, without doping a donor impurity. The resulting crystal is then subjected once to a heat treatment in a Zn melt at a relatively low temperature so as to purposely bring the "deviation from stoichiometry" to go toward the direction in which Se vacancies will be created. By so doing, there is obtained an n type low resistivity crystal. More specifically, the crystal is heat-treated for about 24 hours in a Zn melt at about 900° C. or lower. As a result, the crystal will become a crystal of n type having a resistivity of $0.1-1\omega$-cm.

This latter method may be said to have the drawback of complexity in that the initially manufactured crystal having only a few Se vacancies is converted to an n type low resistivity crystal by again increasing the Se vacancies as the crystal is subjected to heat-treatment in a Zn melt. However, unlike the conventional methods, this method has the following advantages. One of the advantages is that, because no donor impurity is introduced, the doping of an acceptor impurity through either the alloy technique or the diffusion technique during the subsequent formation of a pn junction can be carried out by the use of a relatively small amount of an acceptor impurity. The other advantage is that, as contrasted by the prior method in which the density of the Se vacancies is primarily determined by the manufacturing method which is employed and cannot be controlled, the amount of Se vacancies according to the present invention can be controlled by both the temperature and the time in the subsequent heat-treatment step.

Accordingly, the deviation from stoichiometry can be controlled. In case the n type semiconductor will have a higher resistivity, then a reduced deviation from stoichiometry becomes permissible. For example, if a thermal annealing in a Zn melt is carried out at a temperature ranging from 800° C.–600° C. in a same way as described above, the resistivity will assume a value higher than that mentioned above, but the crystal thus produced will be sufficiently usable as an n type crystal.

Still further, by combining the technique described below with the above-mentioned method, the subsequent formation of a pn junction will be facilitated further.

More particularly, during the step of annealing in a Zn melt, an acceptor impurity such as Bi is introduced in this melt. For example, an amount of Bi is added into the Zn melt at the abovesaid temperature of 900° C. The amount of this acceptor impurity which is introduced is in an amount sufficient to keep the substrate semiconductor in its n type. This acceptor impurity will diffuse inwardly into the semiconductor concurrently as Se vacancies are formed progressively during this heat-treatment step. Although the crystal is of the n type, the impurity as the background within the crystal serves as an acceptor. Thus, subsequent introduction of acceptor impurity by relying on either the alloy method or the diffusion method for changing a portion of the semiconductor into the p type will be facilitated.

As stated above, in order to form a pn junction, an acceptor impurity is doped, through the alloy method or the diffusion method, into an n type crystal which has been treated under control. As an acceptor impurity which is introduced, there is employed, for example, gold (Au).

An example of the method of forming a pn junction by the use of Au as an acceptor impurity will be described below by referring to FIG. 1.

To the rear side of a ZnSe crystal substrate 1 is deposited a metal 5 such as In containing, for example, 5% of Sn for the purpose of providing an ohmic contact. To the front surface is evaporation-deposited an Au film 2 by relying on, for example, a vacuum deposition technique. A crystal substrate 1 as described above is placed on a boat 6 made of, for example, quartz, and the resulting assembly is charged into a quartz tube 7. A vacuum is created inside of this quartz tube 7 by discharging the air contained therein to a level that allows a sufficient substitution by an inert gas 4 such as argon of very high purity, and the air is replaced by the inert gas. Next the inert gas tube 7 containing said crystal substrate 1 therein is heated to a temperature 300°–400° C., preferably 330°–350° C., for about, for example, 3 minutes, and then the whole assembly is cooled gradually.

The reason for employing argon gas is to prevent an increase in the deviation from stoichiometry due to vaporization of Se atoms out of the crystal during the alloy method or the diffusion method in which the acceptor impurity of Au is dopel. Theoretically speaking, however, even with the presence of argon gas, it is not possible to control the partial pressure of Se placed within the quartz tube. In practice, however, the vaporization of Se can be suppressed quite effectively. As such, the inert gas is not limited to argon gas, but another inert gas such as $N_2$ may be employed. It is to be noted here that argon gas is superior in that it has an extremely low reactivity. In case the acceptor impurity Au is to be introduced by either the alloy method or the diffusion method, a container or vessel 3 containing Se metal is placed at an appropriate site upstream of the flow of argon gas within the quartz tube 7. Means are provided so that the Se metal-containing vessel 3 is held at a temperature $T_2$, and the substrate crystal 1 is held at a temperature $T_1$ as mentioned in the temperature distribution chart in FIG. 1. By so doing, Se vapor can be supplied into the argon gas, i.e., into the region where the substrate is placed, for an amount of partial pressure which is determined by the temperature $T_2$. Thus, the vaporization of Se can be suppressed, and this is even more desirable.

The temperature $T_2$ does not need to be set lower than the temperature $T_1$. The reverse can be applied. For example, $T_1$ may be 350° C., and $T_2$ may be 400° C.

A method of introducing Au in an open tube system is shown in FIG. 1. A thermal treatment for making an Au alloy or for the diffusion of Au in a closed tube system by arranging an Se metal-containing vessel and a substrate within a quartz tube is shown in FIG. 1, or by enclosing argon gas at 1 atmosphere pressure within the closed quartz tube. It should be noted here that in such methods as described above, if the alloy formation temperature or the diffusion temperature is set high, the vaporization of Se out of the substrate crystal will become prominent, making the formation of a pn junction difficult. Therefore, such an alloy temperature or diffusion temperature desirably is set as low as possible. For example, gold (Au) has a large diffusion coefficient as an acceptor impurity, and allows the formation of a pn junction at a temperature as low as 350° C.–330° C.

Figure 2:
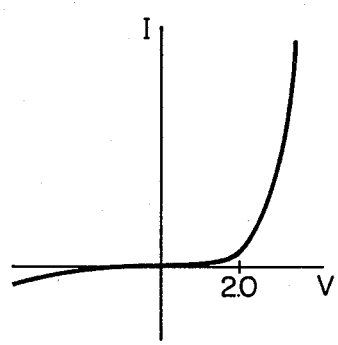
FIG. 2 is a diagram showing an increase in the forward current in the I-V characteristic of a pn junction formed by the use of Au as an acceptor impurity.

When a pn junction is formed using Au as an acceptor impurity in a manner as described above, the forward current in the Group I-V characteristic will exhibit a built-up or increase by the application of a voltage of about 2.0 V or greater. As shown in FIG. 2 the area of the pn junction is 0.3 mm × 0.3 mm. However, in case a pn junction is not formed, and in case Au forms a mere Schottky junction, the build-up in the forward current will start at the application of a low voltage of about 0.7 V. Moreover, when a pn junction is formed, and when a forward current is caused to flow through the device having such a pn junction, the device which is a diode having the required structure will emit light. In the case of a Schottky junction, however, such a phenomenon is not observed. Thus, these two are easily distinguished.

What is claimed is:

1. A method of manufacturing a pn junction with a II-VI compound semiconductor selected from ZnSe, CdS and ZnS, said method comprising:

controlling the vapor pressure of that component element of the compound semiconductor having a higher vapor pressure than the other component element, to a predetermined level during crystal growth by the temperature difference liquid crystal growth method, thereby producing a II-VI compound semiconductor mono-crystal; and doping an acceptor impurity under controlled temperature conditions such that the stoichiometry of the mono-crystal remains substantially constant and the density of the donor level is not greater than the density of the acceptor impurity added.

2. The method according to claim 1 in which the II-VI compound semiconductor is ZnSe and Se is the element whose vapor pressure is controlled.

3. The method according to claim 1 or 2 in which the impurity is gold.

4. The method according to claim 1 or 2 in which:
the impurity is thermally diffused into the mono-crystal which diffusion is conducted in an inert gas atmosphere.

5. The method according to claim 4 in which the inert gas is argon.

6. The method according to claim 4 in which the impurity thermally diffused at a temperature in the range of about 300° to about 400° C.

7. The method according to claim 1 in which the impurity is added by alloying.

8. The method according to claim 4 in which ZnSe is subjected to a heat treatment in a Zn-rich atmosphere prior to the addition of the acceptor impurity to the ZnSe mono-crystal.

9. The method according to claim 1 in which the injection luminescence from the resulting pn junction has a wavelength of not more than 5500 Å.

10. A method of manufacturing a ZnSe pn junction having an injection luminescence of not greater than 5500 Å in a ZnSe compound semiconductor, said method comprising the steps of:

(1) controlling the vapor pressure of Se during crystal growth by the temperature difference liquid crystal growth method so that substantially all of the Se remains in the ZnSe mono-crystal and the stoichiometry of the ZnSe mono-crystal remains substantially constant thereby producing a ZnSe semiconductor mono-crystal; and (2) introducing an acceptor impurity into the ZnSe compound semiconductor maintained in an inert gas atmosphere by doping while controlling the temperature conditions to maintain the stoichiometry of the ZnSe mono-crystal and thermally diffusing the acceptor impurity into the ZnSe mono-crystal in an inert gas atmosphere.

11. The method according to claim 10 in which the acceptor impurity is gold.

12. The method according to claim 10 in which the acceptor impurity is thermally diffused into the ZnSe compound semiconductor in step (2) at a temperature of about 300° C. to about 400° C.

13. A method of manufacturing a ZnSe pn junction having an injection luminescence of not greater than 5500 Å in a ZnSe compound semiconductor, said method comprising the steps of:

(a) providing a ZnSe crystal substrate having an ohmic contact on one surface thereof and a silver film vacuum deposited on the other surface thereof;

(b) introducing the ZnSe crystal substrate into a closed container provided with means for flowing an inert gas over the ZnSe crystal substate;

(c) introducing a vessel containing Se metal into the container;

(d) evacuating the container then flowing an inert gas over the Se metal and, in turn, over the ZnSe substate;

(e) maintaining the ZnSe crystal substrate at temperature $T_1$ and maintaining the Se metal at temperature $T_2$; and (f) independently controlling $T_1$ and $T_2$ to supply Se vapor to the inert gas while controlling the vaporization of Se from the ZnSe crystal substrate by heating the container to a temperature of about 300° C. to about 400° C., then allowing the heated chamber to cool.

14. The method according to claim 13 in which the temperature of step (f) is about 330° C. to about 350° C.

* * * * *